(12) United States Patent
Verruno et al.

(10) Patent No.: US 11,545,352 B2
(45) Date of Patent: Jan. 3, 2023

(54) MULTIPLE BEAM SECONDARY ION MASS SPECTROMETRY DEVICE

(71) Applicant: LUXEMBOURG INSTITUTE OF SCIENCE AND TECHNOLOGY (LIST), Esch-sur-Alzette (LU)

(72) Inventors: Marina Verruno, Esch-sur-Alzette (LU); David Dowsett, Schuttrange (LU); Tom Wirtz, Grevenmacher (LU)

(73) Assignee: LUXEMBOURG INSTITUTE OF SCIENCE AND TECHNOLOGY (LIST), Esch-sur-Alzette (LU)

( * ) Notice: Subject to any disclaimer, the term of this patent is extended or adjusted under 35 U.S.C. 154(b) by 0 days.

(21) Appl. No.: 17/050,098

(22) PCT Filed: Apr. 24, 2019

(86) PCT No.: PCT/EP2019/060449
§ 371 (c)(1),
(2) Date: Oct. 23, 2020

(87) PCT Pub. No.: WO2019/206952
PCT Pub. Date: Oct. 31, 2019

(65) Prior Publication Data
US 2021/0104394 A1 Apr. 8, 2021

(30) Foreign Application Priority Data
Apr. 24, 2018 (LU) .................................. LU100773

(51) Int. Cl.
*H01J 49/40* (2006.01)
*H01J 49/00* (2006.01)
*H01J 49/02* (2006.01)
*H01J 49/06* (2006.01)
*H01J 49/32* (2006.01)
*H01J 49/42* (2006.01)

(52) U.S. Cl.
CPC .......... *H01J 49/40* (2013.01); *H01J 49/0004* (2013.01); *H01J 49/0031* (2013.01);
(Continued)

(58) Field of Classification Search
CPC .... H01J 49/40; H01J 49/0004; H01J 49/0031; H01J 49/025; H01J 49/061; H01J 49/067;
(Continued)

(56) References Cited

U.S. PATENT DOCUMENTS 4,785,172 A * 11/1988 Kubena ................. H01J 49/025
250/288
5,077,470 A * 12/1991 Cody .................... H01J 49/142
250/288
(Continued)

FOREIGN PATENT DOCUMENTS

GB WO 2017087456 * 5/2017 .............. H01J 49/10
WO 2017/087470 A1 5/2017

OTHER PUBLICATIONS

International Search Report dated Jul. 10, 2018, PCT/EP2018/054956, 3 pages.
(Continued)

*Primary Examiner* — Kiet T Nguyen
(74) *Attorney, Agent, or Firm* — Rankin, Hill & Clark LLP

(57) ABSTRACT

A secondary ion mass spectrometer comprising a primary ion beam device, and means for collecting, mass filtering and subsequently detecting secondary ions released from a sample due to the sample having been impacted by a plurality of primary ion beams. The secondary ion mass spectrometer is remarkable in that it uses a plurality of primary ion beams in parallel for scanning the surface of the sample.

15 Claims, 6 Drawing Sheets

(52) U.S. Cl.
CPC .......... *H01J 49/025* (2013.01); *H01J 49/061* (2013.01); *H01J 49/067* (2013.01); *H01J 49/32* (2013.01); *H01J 49/326* (2013.01); *H01J 49/421* (2013.01); *H01J 2237/24435* (2013.01); *H01J 2237/2527* (2013.01)

(58) Field of Classification Search
CPC ........ H01J 49/32; H01J 49/421; H01J 49/142; H01J 49/326; H01J 2237/2527; H01J 2237/24435
USPC ................................ 250/288, 287, 281, 282
See application file for complete search history.

(56) References Cited

U.S. PATENT DOCUMENTS

| | | | |
|---|---|---|---|
| 5,391,962 | A | 2/1995 | Roberts et al. |
| 6,998,622 | B1 | 2/2006 | Wang et al. |
| 2003/0003595 | A1 | 1/2003 | Amirav |
| 2004/0129876 | A1 | 7/2004 | Franzen |
| 2005/0258354 | A1 | 11/2005 | Baba et al. |
| 2005/0258364 | A1 | 11/2005 | Whitehouse et al. |
| 2012/0012746 | A1 | 1/2012 | Herrero et al. |
| 2013/0120894 | A1 | 5/2013 | van Amerom et al. |
| 2014/0034828 | A1 | 2/2014 | Senko et al. |
| 2014/0034844 | A1 | 2/2014 | Ivashin et al. |
| 2014/0361162 | A1* | 12/2014 | Murray ................. H01J 49/405 250/288 |
| 2016/0172146 | A1 | 6/2016 | Wang |
| 2017/0025264 | A1 | 1/2017 | Sedlacek et al. |
| 2018/0330936 | A1* | 11/2018 | Hoyes .................... H01J 49/10 |

OTHER PUBLICATIONS

U.S. Office Action from corresponding U.S. Appl. No. 16/488,984 dated Jun. 15, 2020, 32 pages.

International Search Report, PCT/EP2019/060449 dated Jun. 28, 2019, 2 pages.

\* cited by examiner (a) (b)

MULTIPLE BEAM SECONDARY ION MASS SPECTROMETRY DEVICE

TECHNICAL FIELD

The invention lies in the field of Secondary Ion Mass Spectrometry devices, for use in applications such as analysis or imaging of samples. In particular, the invention concerns a secondary ion mass spectrometry device making use of a plurality of primary ion beams.

BACKGROUND OF THE INVENTION

It is known to use Secondary Ion Mass Spectrometry, SIMS, devices for analytical and imaging purposes. SIMS represents a widely used and extremely powerful technique for performing chemical analysis and imaging of samples. Imaging SIMS has become an indispensable analytical tool in many fields, including but not limited to material sciences, biology, cosmo-chemistry, and geosciences.

In known SIMS devices, a single focused primary ion beam is used to illuminate the surface of a sample. Thereby, material is sputtered from the sample, which creates localised secondary ion emissions stemming from the sample. These secondary ions can be analysed by different kinds of spectrometers. Generally, the secondary ions are first filtered in accordance with their mass-to-charge ratio, and then detected, classified or imaged accordingly.

The current state-of-the-art in high resolution imaging SIMS, is the Cameca™ NanoSIMS 50, with high spatial resolution performance down to 50 nm. Another SIMS technique, known as Time of Flight SIMS, TOF-SIMS, that can achieve a lateral resolution also down to 50 nm for some specific primary ion species. In both of these known systems, the main drawback is that high resolution imaging requires very small size ion probes, which usually means very low primary ion currents, in the order of pico-amperes or less and the area of analysis is generally limited to small fields of view, FOV. For example, the maximum FOV of the NanoSIMS is 80×80 $\mu m^2$. The small primary ion current that is employed leads to long acquisition times and small FOVs require many images to be stitched together to form a mosaic image of the sample surface leading to stitching errors and intensity variations form image to image. These issues make the NanoSIMS (or TOF-SIMS) unsuitable for high-resolution large area imaging or 3D reconstruction. One application for which large area imaging is of particular interest is the mapping of biological systems, e.g. entire rat brains. A typical area of interest on such a brain section would have a size of e.g. 1 $mm^2$. To be imaged with high resolution imaging techniques, the tissue should be scanned with 400 tiles of 50×50 $\mu m^2$. If each tile consists of 512×512 pixels, equivalent to 100 nm probe size (not the smallest probe), and with a dwell time per pixel of 5 ms/pixel, each tile image will take 21.8 min, then the scanning time of the complete tissue will take 145 hrs (6 days), only for one complete surface image. One has to note that the instrument would not remain stable in terms of primary ion current etc. over such a long period. For a 3D reconstruction the acquisition of several layers of the sample (scans), with a minimum of 10 layers, the total acquisition time will be equivalent to 60 days of continuous operation. The only known way to reduce the analysis time has so far been through the development of high brightness ion sources in order to increase the primary ion currents and by keeping a small probe size. In conclusion, a device that can perform high resolution imaging SIMS for larger areas or 3D imaging, in an acceptable time, i.e. yielding high throughput, is currently missing.

Technical Problem to be Solved

It is an objective of the invention to present a device, which overcomes at least some of the disadvantages of the prior art. In particular, it is an objective of the invention to present a secondary ion mass spectrometry device capable of achieving high throughput, while maintaining the possibility for high lateral resolution analysis.

SUMMARY OF THE INVENTION

According to a first aspect of the invention, a secondary ion mass spectrometer is provided. The spectrometer comprises a primary ion beam device, and means for collecting, mass filtering and subsequently detecting secondary ions released from a sample due to the sample being impacted by a plurality of primary ion beams. The primary ion beam device comprises means for emitting at least two primary ion beams simultaneously from an emission plane, and for guiding each primary ion beam to a distinct location on said sample.

The primary ion beam device may preferably comprise one primary ion source for generating a first primary ion beam, and an aperture plate comprising at least two apertures, the arrangement being such that the first primary ion beam projects an image of each aperture on the sample, thereby generating one second primary ion beam for each aperture. Preferably, the aperture plate may define said emission plane.

According to an aspect of the invention, a secondary ion mass spectrometer is provided. The spectrometer comprises a primary ion beam device, and means for collecting, mass filtering and subsequently detecting secondary ions released from a sample due to the sample having been impacted by a plurality of primary ion beams. The spectrometer is remarkable in that the primary ion beam device comprises one primary ion source for generating a first primary ion beam, and an aperture plate comprising at least two apertures, the arrangement being such that the first primary ion beam projects an image of each aperture on the sample, thereby generating one second primary ion beam for each aperture, and in that the spectrometer comprises means for guiding each second primary ion beam to a distinct location on said sample.

Preferably, the aperture plate may extend in a plane that is generally perpendicular to the propagation direction of the first primary ion beam. The diameter of said apertures may preferably be smaller than 100 µm. Further preferably, the diameter of said apertures may be smaller than 50 µm or smaller than 20 µm.

The primary ion beam device may preferably be configured to provide homogeneous ion beam illumination of said aperture plate.

It may further be preferred that the apertures in said aperture plate are mutually equidistant with respect to first neighbours. Preferably, the apertures may be aligned with respect to each other in accordance with a regular square grid.

Preferably, the primary ion beam guiding means may comprise at least one lens. Said lens may preferably comprise an electrostatic lens.

The primary ion beam guiding means may preferably comprise one lens for each second primary ion beam. Said lens may preferably comprise an electrostatic lens.

Preferably, the guiding means may be configured for scanning the primary ion beams over an area of the sample.

The guiding means may preferably comprise a set of deflector plates configured to generate at least one electric field that impacts the trajectory of said ion beams, the strength and direction of the electric field determining the deflection of said ion beams, and the guiding means may further preferably comprise a control unit for determining the strength and direction of said electric field in order to generate a predetermined scanning pattern of said ion beams on said area of the sample. The set of deflector plates may preferably comprise at least two deflector plates.

Preferably the spectrometer may be a double focussing sector spectrometer, and the mass filtering means may comprise an electrostatic sector and a magnetic sector.

Alternatively, the spectrometer may be a time-of-flight spectrometer.

Preferably, the detection means may comprise any of a Faraday Cup, an electron multiplier, a channel electron multiplier, a microchannelplate, MCP, coupled to fluorescent screen and charge coupled device, CCD camera, or an MCP coupled to anode readout, such as a resistive anode encoder or delay line encoder.

In accordance with another aspect of the invention, a method for obtaining an image of the surface of a sample using a secondary mass spectrometer in accordance with embodiments of the invention is provided. The method comprises the following steps:
- directing said at least two primary ion beams to a first set of at least two corresponding locations on the surface of said sample;
- using said detection means, obtaining a representation of the first set of at least two locations on the surface of said sample and storing said representation in a memory element;
- directing said at least two primary ion beams to a second set of at least two corresponding locations on the surface of said sample;
- using said detection means, obtaining a representation of the second set of at least two locations on the surface of said sample and storing said representation in a memory element;
- repeating the previous steps until a representation of a predetermined area on the surface of said sample have been obtained and stored.

The device that is proposed allows to increase analysis speed and hence throughput in secondary ion mass spectrometer analysis or imaging applications, while achieving good lateral resolution. This is achieved by using a plurality of similar primary ion beams for bombarding the sample to be imaged or analysed in parallel. The time for scanning or rastering a given surface area of a sample is divided by N as compared to known single-primary ion beam SIMS devices, where N is the number of primary ion beams that are used. At a given moment in time, multiple (N) points on the surface of the sample are analysed, without moving either the sample or the ion beams. Taking the previous example of the brain tissue, if the sample would be rastered by 100 beams, the analysis time would be 100 times shorter, approximately 1.5 hours for a 2D image, and the 3D reconstruction would be reduced to half a day. In consequence, analyses that currently seemed unfeasible are achievable within a few hours using aspects of the present invention.

BRIEF DESCRIPTION OF THE DRAWINGS

Several embodiments of the present invention are illustrated by way of figures, which do not limit the scope of the invention, wherein.

DETAILED DESCRIPTION OF THE INVENTION

This section describes the invention in further detail based on preferred embodiments and on the figures. Similar reference numbers will be used to describe similar or the same concepts throughout different embodiments of the invention. For example, references 100 and 200 respectively denote two different embodiments of the secondary ion mass spectrometry device in accordance with the invention.

Figure 1:
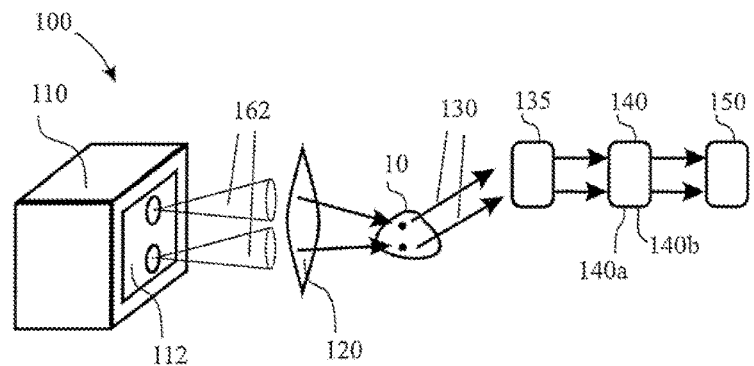
FIG. 1 is a schematic illustration of a device in accordance with a preferred embodiment of the invention.

It should be noted that features described for a specific embodiment described herein may be combined with the features of other embodiments unless the contrary is explicitly mentioned. Features commonly known in the art will not be explicitly mentioned for the sake of focusing on the features that are specific to the invention. For example, the secondary ion mass spectrometry device in accordance with the invention is evidently powered by an electric supply, even though such supply is not explicitly referenced on the figures nor referenced to in the description. FIG. 1 provides an illustration of a secondary ion mass spectrometry, SIMS, device 100 in accordance with a first embodiment of the invention. The SIMS device is used to provide an image representation, or to analyse a sample 10. The SIMS device 100 comprises a primary ion source 110 which comprises an ion beam emission plane 112, from which two primary ion beams 162 are emitted into the direction of the sample. While the example of FIG. 1 shows two primary ion beams, this is by way of example only. The described concept extends straightforwardly to a higher plurality of primary ion beams emitted from the primary ion source. Guiding means 120 are illustrated by way of an electrostatic lens, which is in this example used for focusing the two primary ion beams 162 onto two corresponding points on the surface of the sample 10. The sample is held by a non-illustrated sample holder, just as the guiding means 120 are held in place by appropriate non-illustrated holding means.

Figure 1A:
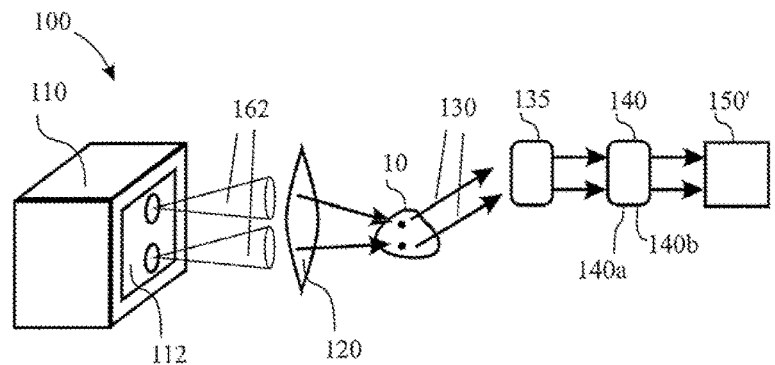
FIGS. 1a, 1b, 1c, 1d, 1e, and 1f schematically illustrate the device of FIG. 1 with a detection means shown as a Faraday cup, an electron multiplier, a channel electron multiplier, a microchannelplate coupled to a fluorescent screen, a CCD camera, and a microchannelplate coupled to an anode readout, respectively.
Figure 1B:
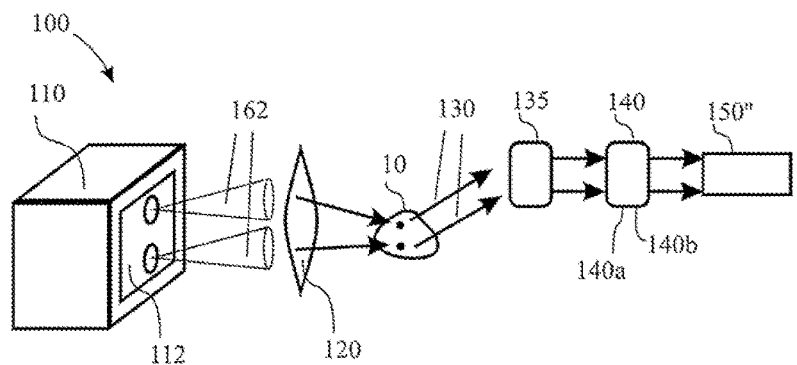
Figure 1C:
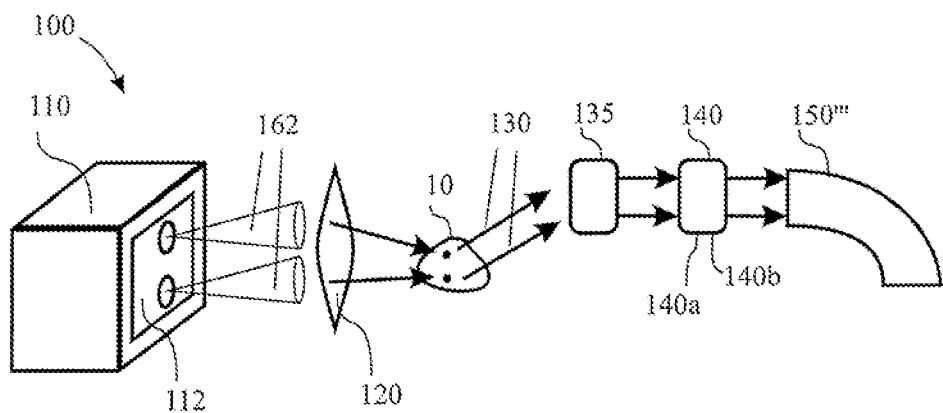
Figure 1D:
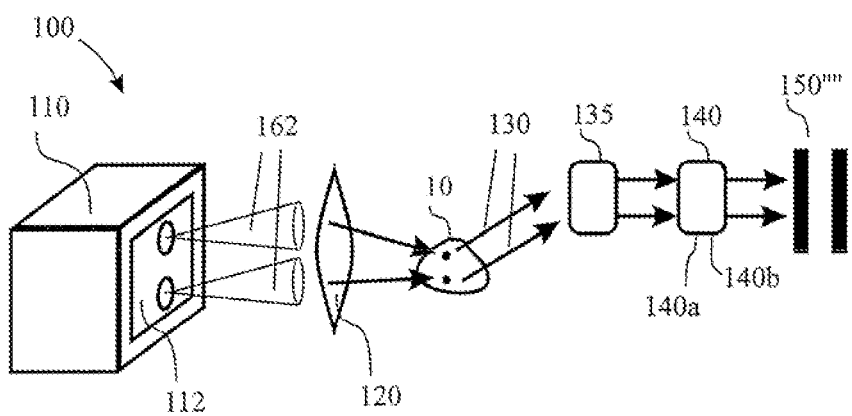
Figure 1E:
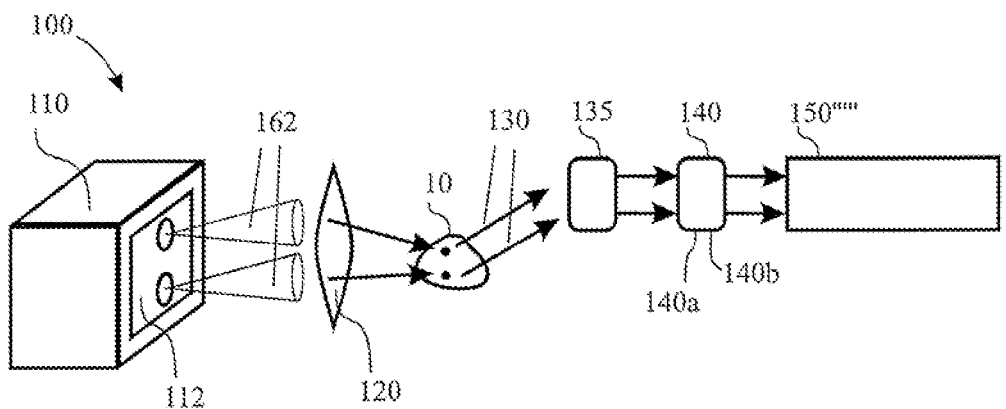
Figure 1F:
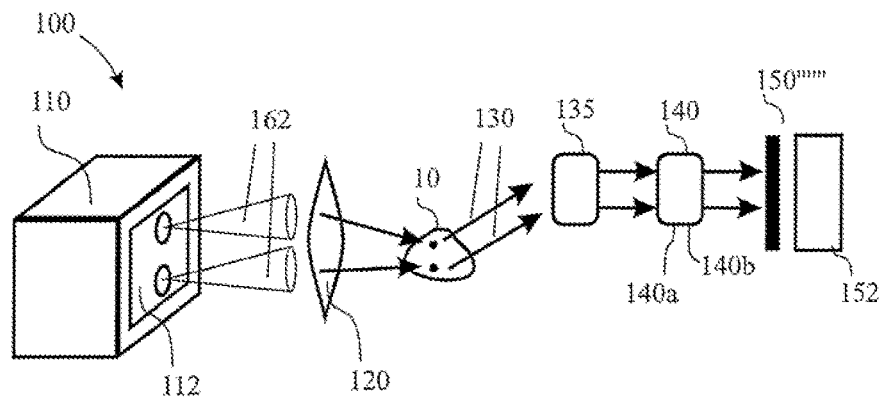

The primary ion source device uses, as in known primary ion source devices, primarily caesium (under the form of $Cs^+$ ions) and oxygen (under the form of $O^-$ or $O_2^+$ ions), but any other ion beams can be used equally well. The primary ions 162 strike the sample 10 with any incidence angle ranging from normal incidence to grazing incidence. Each ion reaches the sample with an energy which typically ranges from 200 eV to 40 keV. The primary ions generate various phenomena on sample surface, and particularly they eject the surface atoms. As a consequence, the primary beam gradually digs a crater at the sample surface, and secondary ions 130 originating from the sample are sputtered from the sample. The SIMS device collects those secondary ions by appropriate collection means 135, which comprise for example a system using electrodes configured for generating an electromagnetic field, which accelerates and/or guides the secondary ions into a preferred direction, e.g., towards the device's mass filtering or analysing means. Indeed, the SIMS device further pore comprises analysing means 140 for filtering them in accordance with their mass-to-charge ratio, and imaging/detection means 150 for visualising and counting the filtered secondary ions. The mass filtering means 140 comprises an electrostatic sector 140a and a magnetic sector 140b, The detection means may be any such means known in the art, comprising for example a Faraday Cup150' as shown in FIG. 1a, an electron multiplier 150" as shown in FIG. 1b, a channel electron multiplier 150'" as shown in FIG. 1c, a microchannelplate, MCP, coupled to fluorescent screen and charge coupled device 150"" as shown in FIG. 1d, a CCD camera 150'"" as shown in FIG. 1e, or an MCP 150"""" coupled to an anode readout 152, such as a resistive anode encoder or delay line encoder as shown in FIG. 1f.

The collection, filtering and detecting means 135, 140, 150 make up a secondary ion column. Such a secondary ion column can be designed in such a way that it has a stigmatic property. That is, for each area, preferably a point, on the surface of the sample from which secondary ions are emitted, a uniquely matching corresponding area, preferably a point, is being imaged by use of the corresponding detected secondary ions. The information from each object point will be displayed in a unique image point corresponding to this object point. Several architectures are known in the art for realising the mass filtering means of the secondary ion column. These include for example time-of-flight systems or double-focussing magnetic sector spectrometers comprising an electrostatic sector followed on the secondary ion trajectory by a magnetic sector. The functioning of these well-known mass filtering architectures is not described in details in the context of the present invention.

FIGS. 2a-2d show various embodiments of a primary ion source device that is capable of generating multiple primary ion beams 262, 262', 262" and 262'" respectively. In FIG. 2a, a primary ion source 260 is used to generate a first primary ion beam 261, and an aperture plate having a plurality of apertures defines an emission plane 212. Thereby the single first primary ion beam 261 is split into an equal plurality of second primary ion beams 262, which are then directed using guiding means 220 towards a non-illustrated sample. This embodiment uses a single primary ion source and a single primary ion column. Per analogy with the secondary ion column, the primary ion column is similar to an optical system, wherein photons would be replaced by ions. Various devices affect the beam propagation: electrostatic lens, diaphragms, slits, stigmators and deflectors.

In FIG. 2b, a primary ion source 260' is used to generate a first primary ion beam 261', and an aperture plate having a plurality of apertures defines an emission plane 212'. Thereby the single first primary ion beam 261' is split into an equal plurality of second primary ion beams 262'. This embodiment uses a single primary ion source and a plurality of dedicated primary ion columns, one per second primary ion beam 262', the latter being then directed using guiding means 220' towards a non-illustrated sample.

In FIG. 2c, a plurality of primary ion sources 260" is used to generate a plurality of first primary ion beams 261". This embodiment uses plurality of dedicated primary ion columns, one per first primary ion beam 261". The plurality of primary ion columns defines an emission plane 212" and the second primary ion beams 262" correspond to the first primary ion beams 261". The beams are then directed using guiding means 220" towards a non-illustrated sample.

In FIG. 2d, a plurality of primary ion sources 260'" is used to generate a plurality of first primary ion beam 261'", which are then fed into a single primary ion column defining a common emission plane 212". The second primary ion beams 262'" correspond to the first primary ion beams 261'". The beams are then directed using guiding means 220'" towards a non-illustrated sample. This embodiment uses a plurality of primary ion source and a single primary ion column.

Figure 2:
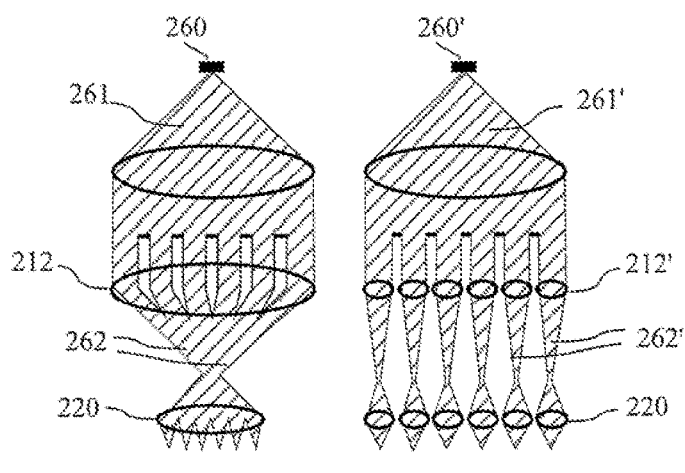
FIGS. 2a, 2b, 2c and 2d illustrate various ion beam devices for producing multiple primary ion beams in accordance with preferred embodiments of the invention.
Figure 2:
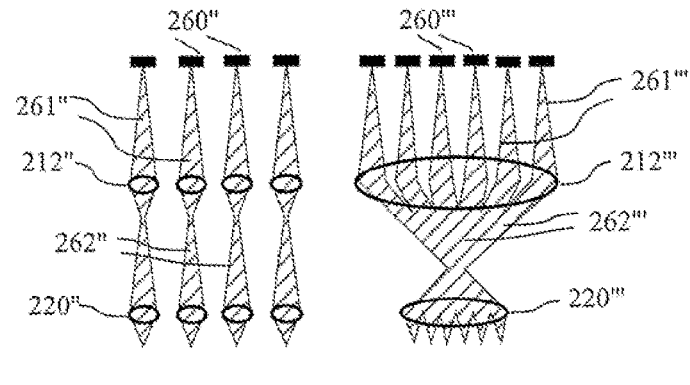
Figure 3:
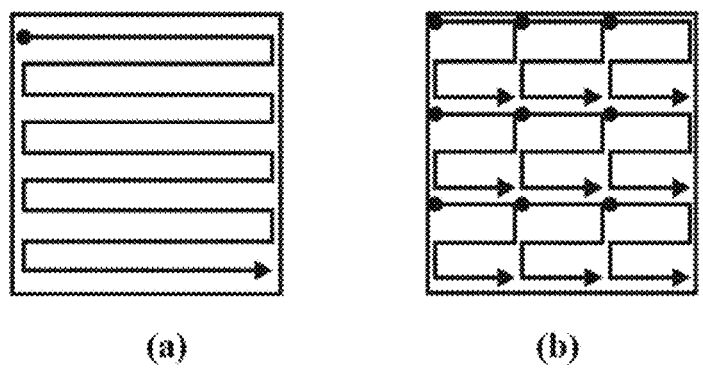
FIGS. 3a and 3b illustrate a scanning path on a sample surface using a single primary ion beam and a plurality of equidistant primary ion beams respectively.

FIG. 3 shows the advantage of using a primary ion beam device in accordance with any of the implementations given in FIG. 2, as compared to known single primary ion beam sources. In FIG. 3a, a square sample is scanned by a known single primary ion beam source. The primary ion beam is first directed to the upper left, and it meanders down to the bottom right in order to scan the entire surface of the sample. In comparison, FIG. 3b shows the effect of scanning the multiple primary ion beams 162, 262, 262', 262" or 262'", as shown in the previous figures, in parallel and simultaneously over the same sample surface. Each primary beam scans a smaller area of the sample while the relative distances between the beams are preserved. Clearly, the scanning time is reduced by a factor N, wherein N is the number of primary beams.

Figure 4:
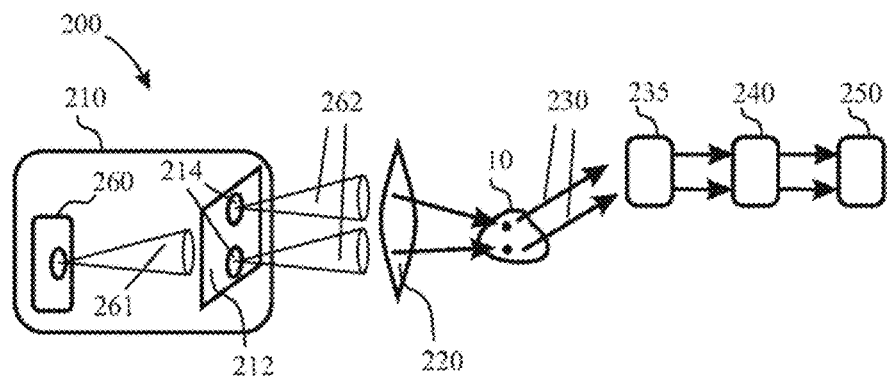
FIG. 4 is a schematic illustration of a device in accordance with a preferred embodiment of the invention.

In FIG. 4, another embodiment of the SIMS device 200 in accordance with the invention is shown. The primary ion beam device 210 follows the general architecture shown in FIG. 2a. The primary ion beam device 210 comprises one primary ion source 260 for generating a single first primary ion beam 261, and an aperture plate 212 comprising, in this non-limiting example, two apertures or through-holes 214. The arrangement is such that the first primary ion beam 261 homogeneously illuminates the back side of the aperture plate 214. Thereby, an image of each aperture 214 is projected by means of the so-generated second primary ion beams 262 in the direction of the sample 10. Each aperture 214 gives rise to one second primary beam 262. The aperture plate is preferably made of a material which provides durability in light of the ion irradiation it suffers during operation of the device 200. It may for example be made of molybdenum, tantalum, or tungsten. Guiding means 220 are illustrated by way of an electrostatic lens, which is in this example used for focusing the two primary ion beams 262 onto two corresponding points on the surface of the sample 10. The sample is held by a non-illustrated sample holder, just as the guiding means 220 are held in place by appropriate non-illustrated holding means. The SIMS device collects those secondary ions by appropriate collection means 235. The SIMS device further comprises analysing means 240 for filtering the secondary ions in accordance with their mass-to-charge ratio, and imaging/detection means 250 for visualising and counting the filtered secondary ions. The detection means may be any such means known in the art, comprising for example a Faraday Cup 150' as shown in FIG. 1a, an electron multiplier 150" as shown in FIG. 1b, a channel electron multiplier 150'" as shown in FIG. 1c, a microchannelplate, MCP, coupled to fluorescent screen and charge coupled device 150″″ as shown in FIG. 1d, CCD camera 150″″′ as shown in FIG. 1e, or an MCP 150″″″ coupled to an anode readout 152, such as a resistive anode encoder or delay line encoder as shown in FIG. 1f.

The smaller the apertures in the aperture plate, the smaller the diameter of each primary ion beam on the sample, and hence the higher the resolution for imaging. By adopting this approach, resolutions of 100 nm or better have been achieved. Preferably, a high-brightness ion source, i.e., a source having a small virtual source size and high emission current, small apertures, i.e., having a diameter smaller than 100 µm, and highly focussing optics with limited aberrations may be used.

Different imaging resolutions may be achieved by adopting different aperture plates having apertures of different diameters. Various imaging setups having different pluralities of closely arranged primary ion beams for illuminating a sample are therefore achievable using the same instrument, featuring a single primary ion column.

Figure 5:
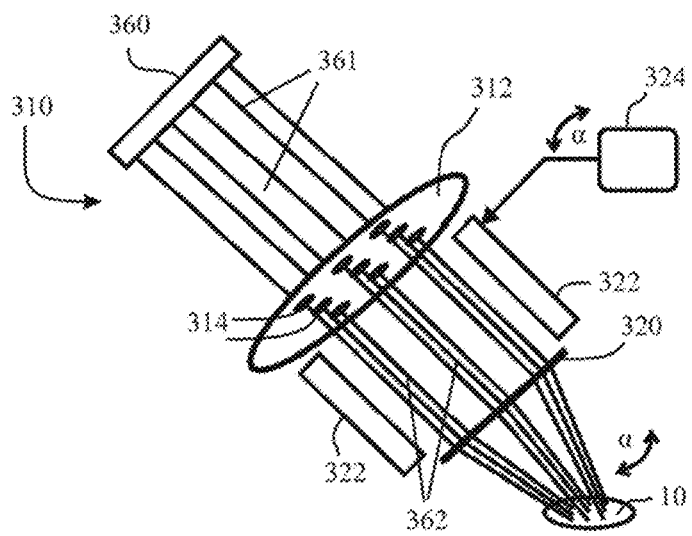
FIG. 5 is a schematic illustration of a detail of device in accordance with a preferred embodiment of the invention.

FIG. 5 shows another embodiment of a primary ion beam device 310 that follows the general architecture shown in FIG. 2a. The primary ion beam device 310 comprises one primary ion source 360 for generating a single first primary ion beam 361, and an aperture plate 312 comprising, in this non-limiting example, nine apertures or through-holes 314. The arrangement is such that the first primary ion beam 361 homogeneously illuminates the back side of the aperture plate 314. Thereby, an image of each aperture 314 is projected by means of the so-generated second primary ion beams 362 in the direction of the sample 10. Each aperture 314 gives rise to one second primary beam 362. The guiding means 320 comprise an electrostatic lens, which is in this example used for focusing the nine primary ion beams 362 onto nine corresponding points on the surface of the sample 10. The sample is held by a non-illustrated sample holder. The guiding means 320 further comprise deflection plates 322 for generating an electric field. The electric field is controlled by a control unit 324 in order to position the second primary ion beams 362 onto an area of interest on the sample 10 and scan the second primary ion beams 362 over this area of interest in accordance with a predetermined pattern. The control unit comprises for example a central processing unit, CPU, configured by way of a software program to provide the described features, and functionally interfaced with said deflection plates 322. This shows one non-limiting way for controlling the direction of the multiple beams 362, which allows for parallel and simultaneously scanning the beams over the surface of the sample.

In what follows a description of an experimental setup will be given by way of a further non-limiting example embodiment of the invention. A known single-beam SIMS device has been modified to include a multi-hole-aperture plate following the architecture of FIG. 2a. Of course, the invention is not limited to such a modified existing spectrometer device. The Cameca™ IMS XF instruments are especially convenient to make a proof-of-concept of multi-ion-beam in SIMS imaging because they have two modes of operation that usually are implemented independently: the microscope mode and microprobe mode. In the microprobe mode, a finely focused primary beam (hundreds of nm to few µm) is rastered across the sample surface while the secondary ions transmitted through the spectrometer are correlated electronically with the position of the primary beam and an image with spatial resolution around the probe size is obtained. In the microscope mode, the primary beam is much broader (40 µm or larger), all points are simultaneously imaged within the Field of View, FOV, in real time, making the acquisition time extremely fast. The image resolution is limited by the secondary optics which is lower than the resolution in microprobe mode.

Combining both modes simultaneously, a new hybrid mode is created, which enables with the aid of a multi-hole aperture plate to generate the multi-ion-beam system. By using the microscope mode, the primary optics is tuned in Köhler illumination mode, making an image of the multi-hole-aperture on the sample. A plurality of second primary ion beams is hence created and guided to the sample, the number N of second primary ion beams corresponding to the number N of holes in the multi-hole-aperture plate. In addition, the stigmatic secondary optics focus the plurality of secondary ion beams emitted by the sample due to the irradiation by a plurality of primary ion beams on a position sensitive detector, for instance an MCP coupled to appropriate read-out means such as a fluorescent screen, CCD camera, resistive anode encoder, delay line detector, or similar, that reproduces the contribution of each mass filtered secondary ion beam emitted by the sample in space. The microprobe capability provides the function of the beam raster, so the multi-ion-beams generated in the primary optics and focused on the sample, can be scanned over the sample at the same time, exactly in the same way as one microprobe.

When microscope mode is on, the aperture plate is illuminated homogenously (Köhler illumination), and a demagnified image of the aperture is projected onto the sample. If the standard aperture with a simple circular hole is replaced by an aperture plate with several small holes, then several micro beams will be generated and focused on the sample that can be scanned across it, like the microprobe mode.

The setup consists of the Cameca™ IMS 4F/6F instruments with a modified detection system comprising the standard MCP and phosphor screen coupled to a fast digital camera. The camera is made by EO Edmund™, model EO-0813C 1/322 CCD colour USB Camera (⅓″, 1024 pixels, size of the pixel 4.65×4.65 µm, 8-bits pixel depth, 1-30 fps, resolution of 0.8 megapixels). The coupling lens is a Computar™ TV Lens of 25 mm diameter, 1:1.3 (fstop=1/3). The detection system is then the combination of the MCP/FS plus the lens/camera. The intrinsic resolution of the MCP/PS system for 150 µm FOV is 400 nm. The dynamic range is 256, limited by the 8 bits camera. The efficiency of the system is smaller than 50%, mainly limited by the MCP useful area.

The parameters that could be varied in this system are the potential applied to the microchannel plate, and the settings of the camera e.g. time frame, colour management, etc. The acquisition of an image with this detection system can vary from short time frames (30 f/s) to longer exposure (1 f/s). For high fluency of secondary ions, the first option represents the physical phenomena quite accurately, but when the secondary current is below $10^4$ c/s the time exposure should be longer to accumulate enough information of each pixel and the image can be reproduced completely. However, another way to increase the time exposure of each pixel of the image is to modify the raster frequency. The standard IMS 4F/6F have the possibility to choose between 20 kHz or 2 kHz. For example, by minimizing the frame rate, exposure time of one second, and using the lower scanning frequency (2 kHz), enhancing the green contrast of the camera and increasing the gain of the microchannel plate, it is possible to have intense and clear images for few thousand counts per second.

The main parameters of the beam in Köhler illumination relevant to the design of the multi-hole aperture are the homogeneity and the intensity of the beam.

The experiments were done in the Cameca IMS 4F where it was possible to characterize the Oxygen beam ($O_2+$) coming from the Duoplasmatron source in the Köhler illumination mode. The ions were extracted at 10 kV and the sample holder was biased at 4.5 kV, thus the impact energy of the ions on the sample was 5.5 keV. The standard process to obtain Köhler illumination in the Cameca IMS XF instruments requires the alignment of the primary column optimizing the current and after, turn down to zero the voltage of the middle lens of the column and align the aperture. When the middle lens is turned off, no intermediate image is generated, and the rays remain quasi parallel until the aperture plate, thus an image of the aperture is produced on the specimen with the aid of the focus lens implementing the guiding means. By moving slightly, the voltage of the focus lens is possible to adjust the beam diameter, within a certain range. The sputtered secondary ions extracted by the immersion lens (in positive mode), are focused through the spectrometer on the channel plate, and a magnified image of the sample is observed on the screen.

The standard apertures of the Cameca instruments consist of a circular aperture with certain profile usually made of molybdenum and mounted on the diaphragm holder, secured by a thin gold or CuBe foil.

The apertures introduced into the aperture holder were designed in a single thin foil of stainless steel, the first is an aperture of 200 µm, the second is a multi-hole aperture with 9 holes of 50 µm diameter, arranged in a matrix of 3×3 separated 150 µm centre to centre, and the third one has 9 holes of 20 µm diameter, also arranged in a matrix of 3×3 separated 100 µm centre to centre. A parameter to consider is the ratio between the aperture diameter and the thickness of the foil to avoid scattering of the ions. Standard apertures have a ratio 1:1. The size of the holes was selected to be sure to have enough current to see images on the screen, considering previous measurements.

In addition to the Cameca IMS 4F, the multi-hole aperture was also mounted in the Cameca IMS 6F to complete the proof-of-concept of the multi-ion-beam SIMS imaging. The aperture was illuminated in Köhler mode with the Caesium beam extracted at 10 kV and the sample holder was always energised at 4.5 kV, thus the mean energy of the ions was 5.5 keV. Images of a grid with the different apertures were acquired with spectrometer tuned to detect $^{133}Cs^+$ secondary ions, for raster sizes from 0 to 50×50 µm² and craters were made for the three set of apertures in InP that were subsequently analysed with a profilometer.

Figure 6:
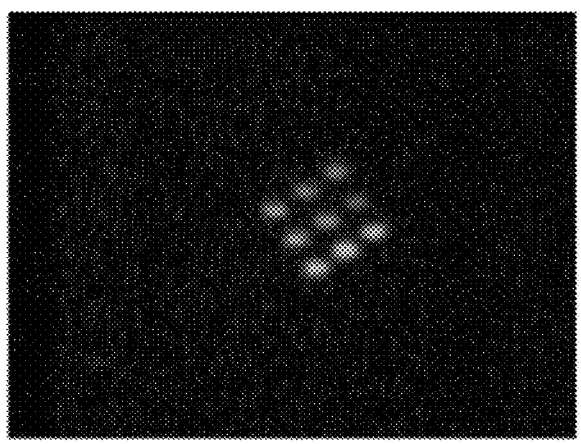
FIGS. 6a and 6b show experimental imaging results obtained using a device in accordance with a preferred embodiment of the invention.
Figure 6:
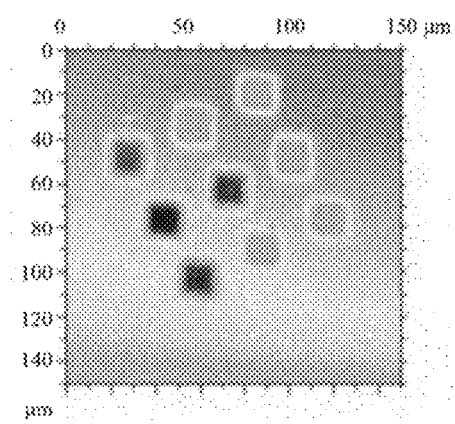
Figure 7:
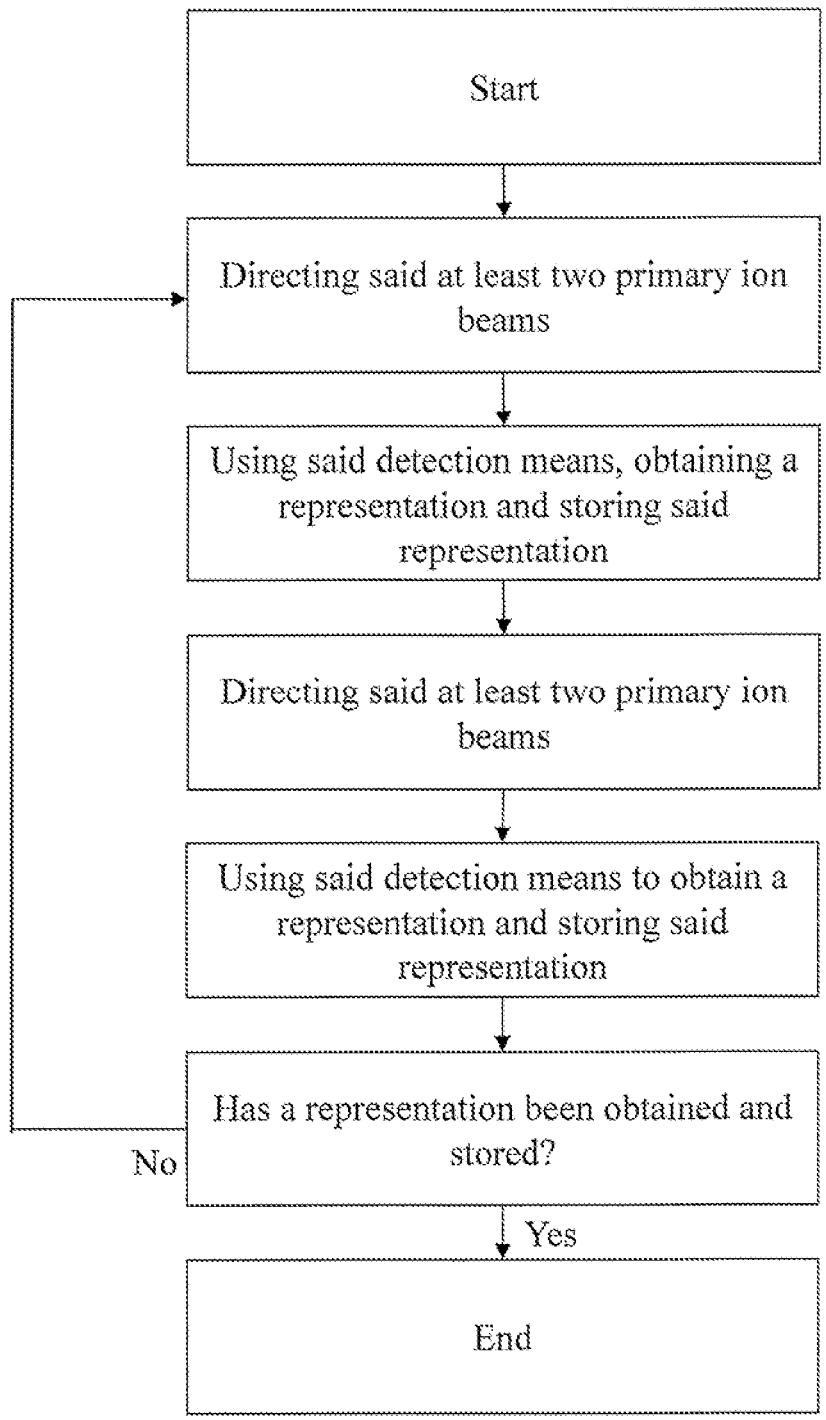
FIG. 7 is a flowchart illustrating a method for obtaining an image of a surface of a sample using a secondary ion mass spectrometer.

FIG. 6a shows the image obtained on the CCD camera behind the MCP detector using the described experimental setup, when the raster was 15×15 µm². In this example, the aperture plate having nine apertures of size 20 µm was used to image an AlCu grid detecting $^{133}Cs^+$). The primary ion current was 20 pA, the secondary ion current was $2\times10^3$ c/s. The raster size was smaller than the distance between the spots on the sample equal to 18 µm, which explains the black spaces (no secondary ion signal) between the bright spots. FIG. 6b is a measurement by profilometer of the area exposed to the 9 primary ion beams, showing the 9 square craters. Both pictures show that the raster with the nine beams works identically as one beam, and the craters are square with flat bottoms. As the raster size increases, the sample area gets fully covered and the image of the AlCu grid is obtained on the screen.

The results show that the multi-ion-beam are transmitted successfully across the complete instrument, primary and secondary optics. It should be noted that the actual number of apertures in the aperture plates, as well as their dimensions, depend on the application in which it finds their uses. These parameters can be fixed by the skilled person without departing from the scope of the present invention.

It should be understood that the detailed description of specific preferred embodiments is given by way of illustration only, since various changes and modifications within the scope of the invention will be apparent to the person skilled in the art. The scope of protection is defined by the following set of claims.

The invention claimed is:

1. A secondary ion mass spectrometer, comprising:
   a primary ion beam device,
   a means for collecting, mass filtering and subsequently detecting secondary ions released from a sample due to the sample having been impacted by a plurality of primary ion beams, wherein the primary ion beam device comprises one primary ion source for generating a first primary ion beam, and an aperture plate comprising at least two apertures, such that the first primary ion beam projects an image of each aperture on the sample, thereby generating one second primary ion beam for each aperture, and
   a means for guiding each second primary ion beam to a distinct location on said sample.

2. The secondary ion mass spectrometer according to claim 1, wherein said aperture plate extends in a plane that is perpendicular to a propagation direction of the first primary ion beam.

3. The secondary ion mass spectrometer according to claim 1, wherein said primary ion beam device is configured to provide homogeneous ion beam illumination of said aperture plate.

4. The secondary ion mass spectrometer according to claim 1, wherein the apertures in said aperture plate are mutually equidistant.

5. The secondary ion mass spectrometer according to claim 1, wherein the diameter of said apertures is smaller than 100 µm.

6. The secondary ion mass spectrometer according to claim 1, wherein said guiding means comprise at least one lens.

7. The secondary ion mass spectrometer according to claim 1, wherein said guiding means comprise one lens for each second primary ion beam.

8. The secondary ion mass spectrometer according to claim 1, wherein said guiding means are configured for scanning the primary ion beams over an area of the sample.

9. The secondary ion mass spectrometer according to claim 8, wherein the guiding means comprise a set of deflector plates configured to generate at least one electric field that impacts the trajectory of said ion beams, a strength and direction of the electric field determining the deflection of said ion beams, and wherein the guiding means further comprise a control unit for determining the strength and direction of said electric field in order to generate a predetermined scanning pattern of said ion beams on said area of the sample.

10. The secondary ion mass spectrometer according to claim 1, wherein the secondary ion mass spectrometer is a double focusing magnetic sector spectrometer, and wherein the mass filtering means comprise an electrostatic sector and a magnetic sector.

11. The secondary ion mass spectrometer according to claim 1, wherein the secondary ion mass spectrometer is a time-of-flight spectrometer.

12. The secondary ion mass spectrometer according to claim 1, wherein the detection means is at least one of a Faraday Cup, an electron multiplier, a channel electron multiplier, a microchannelplate coupled to fluorescent screen and charge coupled device, CCD camera, and a microchannelplate coupled to an anode readout.

13. The secondary ion mass spectrometer according to claim 12, wherein the anode readout is a resistive anode encoder.

14. The secondary ion mass spectrometer according to claim 12, wherein the anode readout is a delay line encoder.

15. A method for obtaining an image of a surface of the sample using the secondary ion mass spectrometer in accordance with claim 1, wherein the method comprises the following steps:

directing said at least two primary ion beams to a first set of at least two corresponding locations on the surface of said sample;

using said detection means, obtaining a representation of the first set of at least two locations on the surface of said sample and storing said representation in a memory element;

directing said at least two primary ion beams to a second set of at least two corresponding locations on the surface of said sample;

using said detection means to obtain a representation of the second set of at least two locations on the surface of said sample and storing said representation in the memory element; and repeating the previous steps until a representation of a predetermined area on the surface of said sample have been obtained and stored.

* * * * *